United States Patent [19]

Hino et al.

[11] Patent Number: 4,621,419

[45] Date of Patent: Nov. 11, 1986

[54] AUTOMATIC IC MOUNTING PROCESS AND APPARATUS FOR PERFORMING THE PROCESS

[75] Inventors: Toshikatsu Hino; Fumio Arase; Takashi Ohshima, Oyama, all of Japan

[73] Assignee: Fujitsu Limited, Kawasaki, Japan

[21] Appl. No.: 687,283

[22] Filed: Dec. 28, 1984

[30] Foreign Application Priority Data

Dec. 29, 1983 [JP] Japan ................................ 58-247691

[51] Int. Cl.[4] .......................... H05K 3/30; B23P 23/00
[52] U.S. Cl. ..................................... 29/837; 29/564.1; 29/741
[58] Field of Search ...................... 29/741, 564.1, 838, 29/837

[56] References Cited

U.S. PATENT DOCUMENTS 3,508,315  4/1970  Hoffken ............................ 29/838 X
3,550,238  12/1970  Allen et al. ...................... 29/564.1 X
4,367,584  1/1983  Janisiewicz et al. ............ 140/147 X

FOREIGN PATENT DOCUMENTS 147451  4/1981  Fed. Rep. of Germany ........ 29/837

OTHER PUBLICATIONS

IBM Tech Disclosure Bull, vol. 26, No. 7B, Dec. 1983, pp. 3664-3665 by DiLorenzo et al.

IBM Tech Disclosure Bull, vol. 26, No. 9, Feb. 1984, pp. 4452-4454 by Boyle et al.

Primary Examiner—Howard N. Goldberg
Assistant Examiner—Carl J. Arbes
Attorney, Agent, or Firm—Staas & Halsey

[57] ABSTRACT

An automatic IC mounting process for mounting a plurality of ICs on an upper surface of a printed circuit board in accordance with a predetermined sequence program. Each of the ICs has a plurality of leads, each of which is to be inserted into a predetermined corresponding through-hole of the printed circuit board. The process includes: (i) a step for inserting the leads of an IC into the through-holes of the printed circuit board; (ii) a step for detecting whether or not each lead of the IC is correctly inserted into the corresponding through-hole after every step (i); (iii) a step for removing a misinserted IC having a misinserted lead from the printed circuit board and discarding the misinserted IC into a predetermined reject place immediately after a misinsertion is detected in the step (ii); (iv) a step for memorizing the information for identifying the misinserted IC; (v) a step for mounting a predetermined number of subsequent ICs on the printed circuit board in accordance with the predetermined sequence program, leaving the position of the misinserted IC unmounted; (vi) a step for searching for whether or not the information was memorized in the step (iv); and, (vii) a step for preparing a new IC identified by that information and remounting it on the printed circuit board at the position of the misinserted IC.

9 Claims, 15 Drawing Figures

Fig. 7
Fig. 8
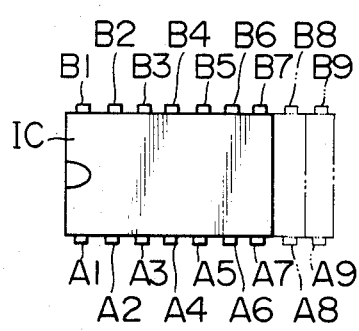
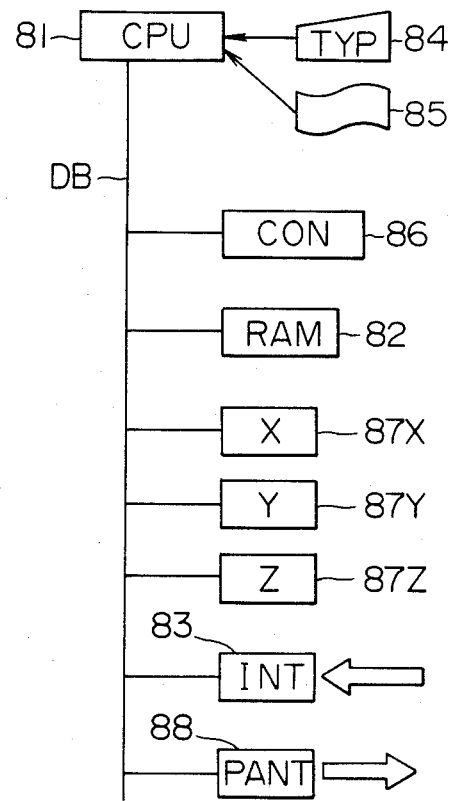

AUTOMATIC IC MOUNTING PROCESS AND APPARATUS FOR PERFORMING THE PROCESS

BACKGROUND OF THE INVENTION

1. Field of the Invention

The present invention relates to an automatic Integrated Circuit (IC) mounting system for mounting a plurality of ICs on a printed circuit board in sequence.

2. Description of the Related Art

A plurality of IC's, such as Dual-in-line package (DIP) type IC's which comprise leads disposed side by side in row and projecting from each of the side faces of a box-shaped package, are mounted on a printed circuit board which is installed in various kinds of electronic devices, communication devices, and the like. An automatic IC mounting system is used for automatically mounting IC's in a printed circuit board during mass-production of a device comprising a number of such printed circuit boards. The IC mounting system inserts the leads of each IC into through-holes of the printed circuit board and every one of the leads of each IC must be inserted into the corresponding and correct through-hole.

The automatic IC mounting system of the prior art comprises a tridimensionally movable arm and an insertion head attached to the end of the arm. The insertion head comprises a picker having a pair of finger plates facing each other, for picking-up and holding an IC therebetween. The IC is picked up by the picker and conveyed toward a printed circuit board placed on a table at a predetermined location. When the IC is conveyed to a predetermined position above the printed circuit board, a pusher descends between the pair of finger plates and urges the IC held between the finger plates downward in such a manner that the IC leads are inserted into corresponding through-holes of the printed circuit board. Such an IC insertion operation is repeated by the system for a plurality of ICs to be mounted on the printed circuit board in sequence.

If one of the IC leads should be accidentally bent or distorted in the conveyance thereof or in the preceding manufacturing process thereof, the distorted lead cannot be inserted into the through-hole but will be bent back and folded upon the upper surface of the printed circuit board by the pressure of the pusher on the IC. The printed circuit board on which such misinserted IC is mounted cannot perform a predetermined function and must be scrapped. Therefore, after the mounting process for the ICs, all of the leads of the ICs are checked by a detection means to ensure that each lead is correctly inserted into the corresponding through-hole of the printed circuit board.

When a misinserted IC is detected by the detection means an alarm is actuated by the detection means and the operation of the system is stopped. An operator must then replace the misinserted IC with a new IC by hand before the operation of the IC mounting system can be restarted.

However, in accordance with the above mentioned automatic IC mounting system, the productivity of the printed circuit board is greatly lowered, since the flow of the IC mounting process is stopped when replacing the misinserted IC. Also, the reliability of the manual replacement operation by the operator is low since the new IC may be wrongly mounted at an incorrect position or an incorrect IC may be mounted.

SUMMARY OF THE INVENTION

An object of the present invention is to provide an automatic IC mounting system in which, when an IC is misinserted, the misinserted IC is replaced without interrupting the flow of the sequence process for mounting a plurality of IC's on a printed circuit board. Thus achieving a completely automatic IC mounting operation which enhances the productivity and reliability of the products.

In accordance with the present invention, there is provided an automatic IC mounting process for mounting a plurality of IC's on an upper surface of a printed circuit board in sequence, each of the ICs having a plurality of leads which are to be inserted into predetermined through-holes of the printed circuit board. The process according to the present invention comprises: an insertion step for inserting the IC leads into the through-holes of the printed circuit board; a detection step for detecting whether or not each lead of the IC is correctly inserted into the predetermined through-hole, after each insertion step of every IC; a removal step for removing the misinserted IC having a misinserted lead from the printed circuit board and discarding the misinserted IC at a predetermined place, immediately after a misinsertion is detected in the detection step; a memorizing step for memorizing the information regarding the detection of misinsertion of the IC lead and the identification of the misinserted IC; a subsequent mounting step for mounting a predetermined number of subsequent ICs on the printed circuit board in sequence, after the misinserted IC is removed from the printed circuit board, leaving the location of the misinserted IC on the printed circuit board unmounted; a checking step for checking the presence of the memorized information regarding the detection of misinsertion; and, a remounting step for preparing a new IC identified by the memorized information and remounting the new IC on the printed circuit board at the location from which the misinserted IC was removed.

BRIEF DESCRIPTION OF THE DRAWINGS

FIG. 7 is an upper view of an IC which is used in the present invention and detected by the detection means of FIG. 6.

FIG. 8 is a block diagram of the IC mounting system in accordance with the present invention.

DESCRIPTION OF THE PREFERRED EMBODIMENTS

Figure 1:
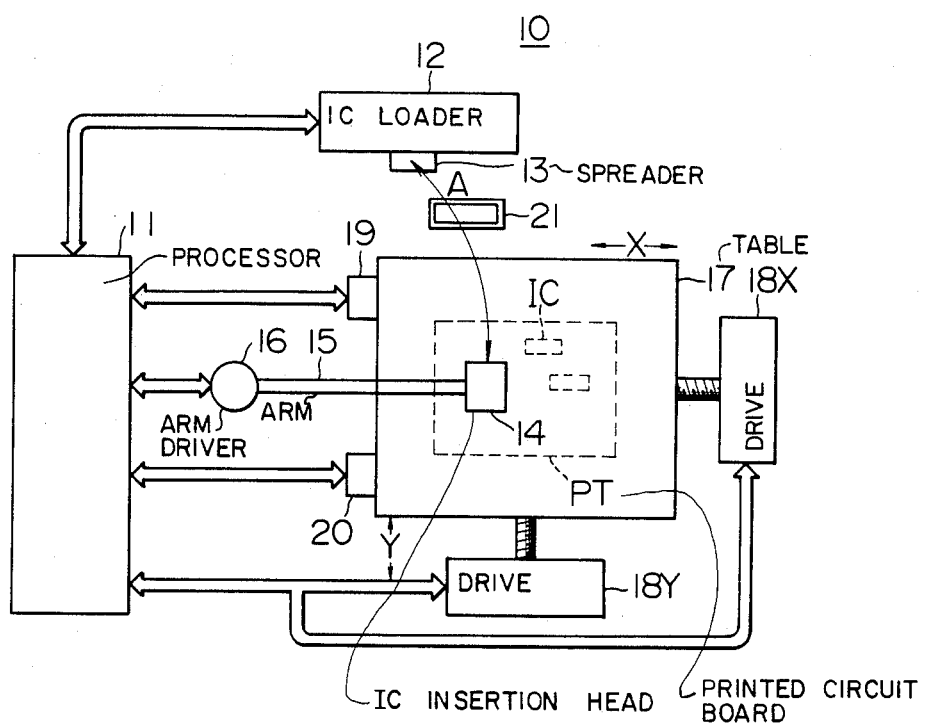
FIG. 1 is a schematic view of an automatic IC mounting system in accordance with the present invention.

An automatic IC mounting system in accordance with the present invention is schematically illustrated in FIG. 1. In the Figure, a plurality of IC's and other electronic parts (not shown) are mounted on a printed circuit board PT. The system comprises an automatic IC mounting apparatus 10 including a processor 11 which controls the automatic operation of the system. Various kinds of ICs are housed in an IC loader 12. The processor 11 orders an IC to be mounted on the printed circuit board PT. The IC ordered by the processor 11 is fed into a spreader 13 from the IC loader 12. The IC is picked up from the spreader 13 and conveyed to a position above the printed circuit board PT by an IC handling means comprising an IC insertion head 14 attached at an end of an arm 15 which is driven by an arm driver 16. The IC insertion head 14 is movable as shown by arrows A so as to convey the IC picked-up from the spreader 13 to the printed circuit board PT. The movement of the head 14 is controlled by the processor 11.

The printed circuit board PT is set and secured on an X-Y table 17 which is slidable in an X-direction by a drive means 18X and in a Y-direction by another drive means 18Y. The printed circuit board PT is positioned at a desired location by moving the X-Y table 17 so that the printed circuit board PT is located immediately below the IC insertion head 14, which holds an IC which is to be mounted at that place on the printed circuit board PT. Such a movement of the X-Y table is also controlled by the processor 11.

After the printed circuit board PT is positioned at the desired position below the insertion head 14, a pusher (not shown) installed within the head 14 descends to push the IC held by the head 14 downward, in such a manner that the leads of the IC are inserted into corresponding through-holes of the printed circuit board PT. Such an insertion movement is also controlled by the processor 11.

A detection means 19 is provided for detecting whether or not each lead of the IC is correctly inserted into a corresponding through-hole. The detection means 19 emits a misinsertion signal if one of the IC leads is not correctly inserted into its corresponding through-hole. In practice, such a detection means 19 is disposed below the insertion head 14 and under the printed circuit board PT, as described later as an embodiment of the present invention.

The system of the present invention performs the following functions upon detection of the misinsertion of an IC lead by the detection means 19, instead of immediately replacing the misinserted IC manually with a new IC by temporarily stopping the system operation, as in the prior art. First, the identification number of the misinserted IC or corresponding information regarding the IC is memorized in the processor 11. Second, the misinserted IC is pushed up from the printed circuit board PT by a rejection means 20, picked up by the insertion head 14 and discarded into a reject tray 21 by driving the arm 15. In practice, the rejection means 20 is disposed below the insertion head 14 and under the printed circuit board PT, as described later as an embodiment of the present invention. Third, a subsequent IC which is fed on the spreader 13 is mounted on the printed circuit board PT at a predetermined place according to the predetermined sequence leaving the position of the misinserted IC unmounted, without stopping the system operation for manually remounting a new IC at the position of the misinserted IC.

When the sequence program for mounting the predetermined number of ICs on the printed circuit board is ended, the unmounted position of the printed circuit board is filled with a new IC in accordance with the information regarding the misinserted IC memorized in the processor 11. The new IC is automatically remounted on the printed circuit board in accordance with the same sequence program as that applied to the original IC memorized in the processor 11, i.e., a same new IC is fed from the IC loader 12 to the spreader 13 in accordance with the memorized information, then the IC is picked up and conveyed to the printed circuit board by the insertion head 14 and the IC leads are inserted into the through-hole of the printed circuit board which has already been repositioned in accordance with the data regarding the position of the misinserted IC, such position data being obtained from the aforementioned memorized information or by reading from the original program.

The sequence of the functions of the automatic IC mounting apparatus of FIG. 1 is shown in the flow chart of FIG. 2, as follows:

In step ⓐ, a printed circuit board PT is set on the X-Y table 17.

In step ⓑ, the printed circuit board PT is positioned by the function of the X-Y table at a position where the position for mounting the IC held by the insertion head 14 is located immediately below the insertion head 14. The insertion head 14 then inserts the IC leads into the corresponding through-holes of the printed circuit board on the X-Y table 17.

In step ⓒ, the detection means 19 detects whether or not each lead of the IC is correctly inserted into the corresponding through-hole of the printed circuit board.

In step ⓓ, if the detection means 19 detects that one of the IC leads is misinserted into the through-hole in the step, ⓒ, the identification number of the IC and/or other information for identifying the IC are memorized in the processor 11.

In step ⓔ, the misinserted IC is removed from the printed circuit board PT by the rejection means 20 and discarded in the reject tray 21.

In step ⓕ, if the detection means 19 detects no misinsertion of any IC leads, the mounting operation of a subsequent IC is repeated until all of the predetermined ICs are mounted on the printed circuit board PT.

In step ⓖ, when the insertion sequence of the program for mounting all of the predetermined IC's is finished, the processor 11 researches the occurrence of IC misinsertion in the prosecution of mounting the ICs by checking its memory for information regarding misinserted IC.

In step, ⓗ, if an IC was misinserted during the insertion sequence program, the processor 11 orders the reinsertion of a new IC in place of the misinserted IC.

In step ⓘ, the identification number of the misinserted IC is from the memorized information and a replacement IC is fed to the spreader 13 from the IC leader 12, in accordance with the reinsertion order of step ⓗ. The new IC is then mounted on the printed circuit board in accordance with the aforementioned mounting sequence program.

In step ⓙ, when the judgement is Yes in step ⓖ (i.e., when no IC misinsertion occurred during the sequence program for mounting the IC's or when the misinserted IC is correctly replaced by a new IC through step (h), (i), (b), (c), and (f)), the printed circuit board PT is dismounted from the X-Y table.

In step (k), if there is a subsequent printed circuit board on which the ICs are to be mounted in accordance with the same sequence program, the printed circuit board is set on the X-Y table and the IC mounting operation is repeated in the same manner as described before.

If there is no subsequent printed circuit board, the IC mounting operations in accordance with the program is ended.

Figure 3:
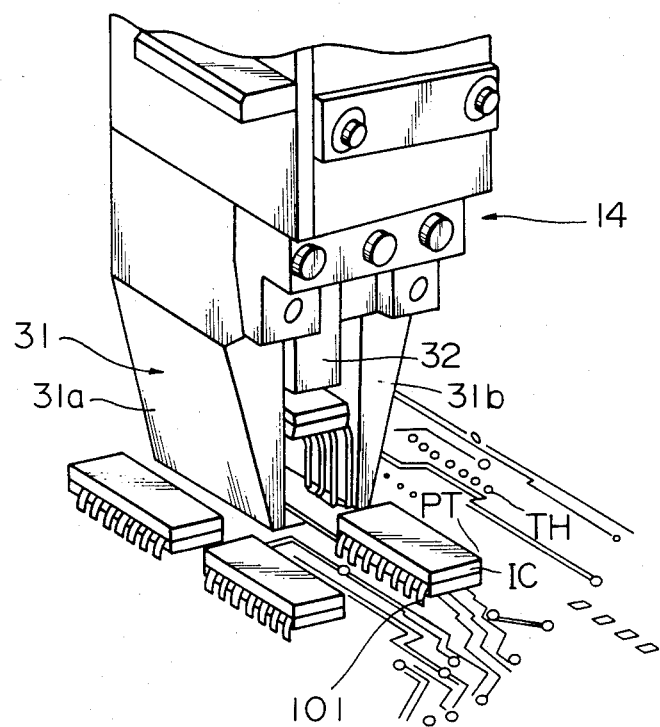
FIG. 3 is a perspective view of a head for handling an IC used in the system of FIG. 1.

An external view of the insertion head 14 is illustrated in FIG. 3. The insertion head 14 comprises a picker 31 having a pair of finger plates 31a and 31b and a pusher 32. The picker 31 holds an IC between the pair of finger plates 31a and 31b. The pusher 32 pushes the IC downward to insert each IC lead 101 into the corresponding through-hole TH of the printed circuit board PT.

Figure 2:
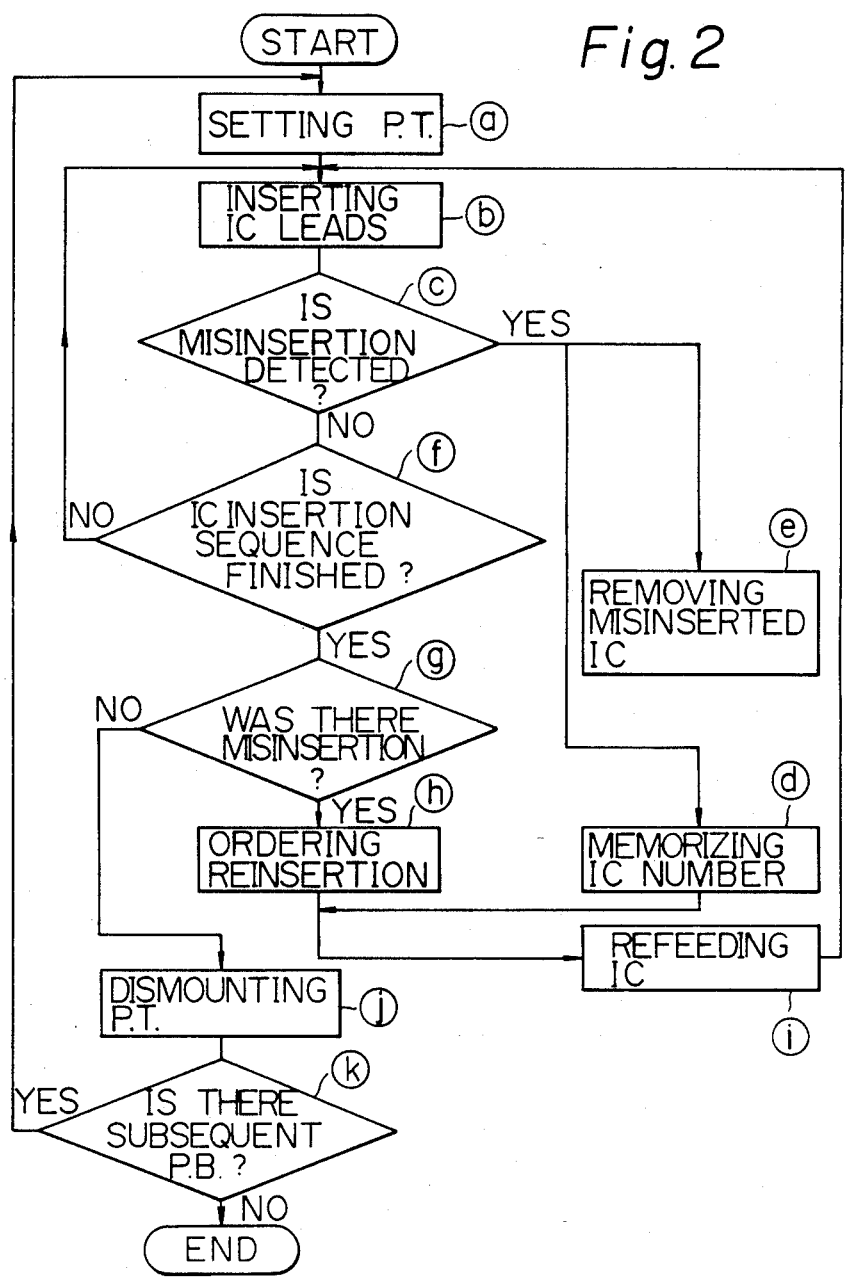
FIG. 2 is a flow chart of the function of the system of FIG. 1.
Figure 4:
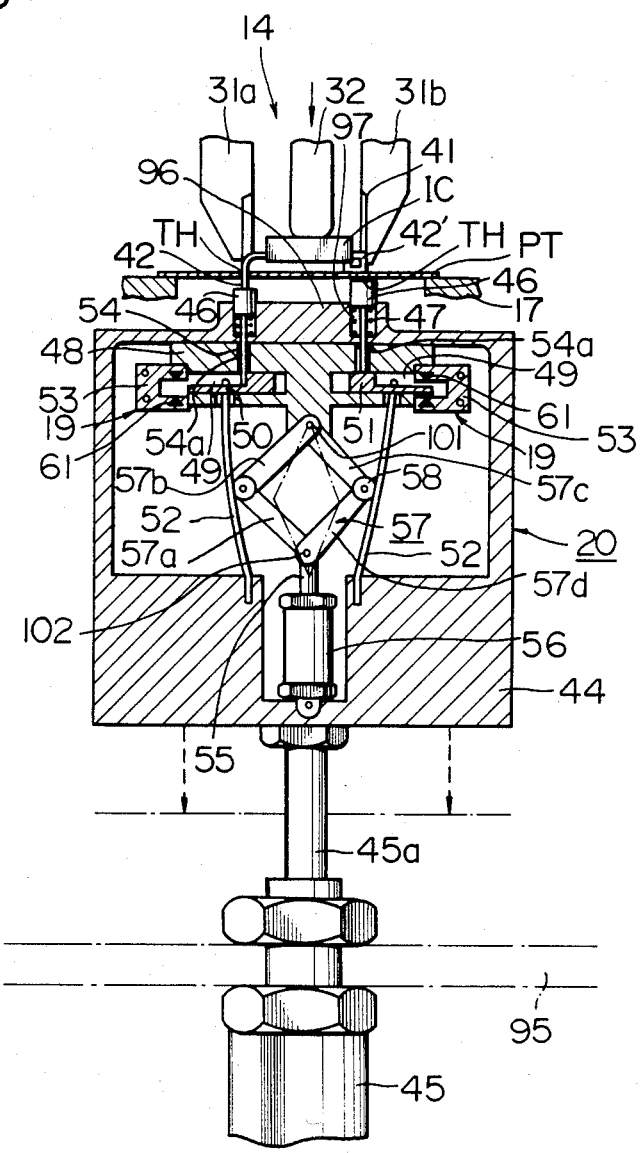
FIG. 4 is a sectional view of a main part of the system of FIG. 1.

Examples of both the detection means 19 used in step (c) of FIG. 2 and the rejection means 20 used in step (c) of FIG. 2 are illustrated in FIG. 4. The function of the structure of FIG. 4 is illustrated in detail in FIG. 5 in series from (1) to (6). FIG. 4 represents an IC misinsertion situation wherein an IC lead 42' at the right side of the IC is misinserted while an IC lead 42 at the left side of the IC is correctly inserted into the through-hole TH of the printed circuit board PT. A cause of the misinsertion of the IC lead 42' is, for example, that the lead tip has been unintentionally bent in the preceding process of producing the IC and the bent lead tip abuts against the upper surface of the printed circuit board PT instead of passing through the through-hole TH when the pusher 32 urges the IC downward; thus bending the IC lead 42' through the downward force of the pusher 32.

The detection means 19, which is described later in detail, is housed in a box-shaped housing 44 disposed below the printed circuit board PT and vertically movable by piston 45a of a drive cylinder 45. FIG. 4 represents the housing 44 at an upper dead point thereof. The cylinder 45 is secured to a frame 95 of the apparatus.

A plurality of small cylindrical abutment members 46 are disposed in two rows perpendicular to the drawing sheet corresponding to the leads of the IC. Each abutment 46 is secured to the upper end of a rod 54 and disposed in a hole 97 of an upper plate 96 of the housing 44. A compression coil spring 47 is installed in the hole 97 so as to urge the abutment 46 upward and project it from the hole 97 when no downward force is applied thereto. In the situation shown in FIG. 4, wherein the housing 44 is at the upper dead point, the left abutment 46 abuts against the IC lead 42 projecting downward through the through-hole TH of the printed circuit board PT and is pushed back into the hole 97 against the force of the spring 47, since the IC is prevented from making an upward movement due to the pusher 32 at the lower dead point thereof, and the right abutment 46 reaches or comes close to the under surface of the printed circuit board PT since the IC lead 42' is not inserted into the through-hole TH. An E-ring 54a is provided on each rod 54 so as to prevent the abutment 46 from drawing out of the hole 97.

A slider holder 48 is disposed below the upper plate 96 of the housing 44, and a horizontal recess 49 is formed in each side of the slider holder 48. A plurality of sliders 50 are disposed in the recess 49 in a row perpendicular to the drawing sheet, corresponding to the abutment 46. Each slider 50 engages with a corresponding rod 54 of the abutment 46. The slider 50 is slidable to the right and left directions in the drawing. The slider 50 comprises a thickened portion 51 disposed inward of the recess 49 of the slider holder 48. A rod or wire 52 having elasticity, such as a piano wire, is secured to each slider 50. The lower end of the wire 52 is secured to the housing 44, so that the wire 52 urges the slider 50 inward in the recess 49 due to the elasticity thereof. A plurality of wires 52 are disposed side by side in a row in the direction perpendicular to the drawing sheet; each wire 52 corresponding to an abutment 46.

A U-shaped sensor holder 53 is disposed at the outer opening end of the recess 49 of the slider holder 48. The opening of the U-shaped sensor holder 53 faces to the opening of the recess 49, so that the outer end of the slider 50 disposed in the recess 49 can enter into the sensor holder 53. A sensor means, such as photosensor 61 comprising a pair consisting of a laser diode and a phototransistor, is provided at the entrance of the U-shaped sensor holder 53, so that the photosensor 61 can detect whether the slider 50 is inserted into the sensor holder 53 or not, as described later. Each rod 54 of abutment 46 projects into the recess 49 of the slider holder 48 through a through-hole formed in the holder 48 and engages with the slider 50.

A pantograph 57 is disposed in the housing 49. The pantograph 57 comprises four link pieces 57a–57d, which are pivotably linked together at each end thereof, forming a rhombus which can be extended vertically and horizontally. An upper pivot 101 of the pantograph 57 is secured to the lower end of the slider holder 48. A lower pivot 102 of the pantograph 57 is secured to a piston rod 55 of a drive cylinder 56. The pantograph 57 is disposed at each longitudinal end (with respect to the direction perpendicular to the drawing sheet) of the slider holder 48. The two pantographs 57 disposed at both ends of the slider holder 48 are connected together by a pivot bar 58 disposed at each of the right and left pivots and extended in the direction perpendicular to the drawing sheet. The pivot bar 58 engages with the row of the wires 52 disposed side by side in the direction perpendicular to the drawing sheet. When the piston rod 55 moves upward, the rhombus of the pantograph 57 is horizontally widened and each pivot bar 58 urges the row of wires 52 outward. When the piston rod 55 moves downward, the pivot bars 58 move inward so that the wires 52 are restored to their original position, due to their elasticity.

In FIG. 4, the pantograph 57 is shown as horizontally widened so that the pivot bars 58 are urging the wires 52 outward.

Regarding the correctly inserted IC lead 42, the abutment 46 abuts against the IC lead 42 so that the lower end of the rod 54 projects into the recess 49 and engages the thickened portion 51 of the slider 50. Therefore, the slider 50 is prevented from moving outward (leftward). On the other hand, for the misinserted IC lead 42', the abutment 46 does not abut against the lead 42' and projects out of the hole 97 to an extent such that the lower end of the rod 54 is retracted within the hole of the slider holder 48. Therefore, the rod 54 does not engage with the thickened portion 51 of the slider 50, which allows the slider 50 to move outward (rightward). Accordingly, the slider 50 enters into the sensor holder 53 and blocks the optical passage of the photosensor 61, and thus, the photosensor 61 detects the misinsertion of the IC lead 42'.

The IC insertion and removal operation is described hereinafter with reference to FIG. 5.

Figure 5:
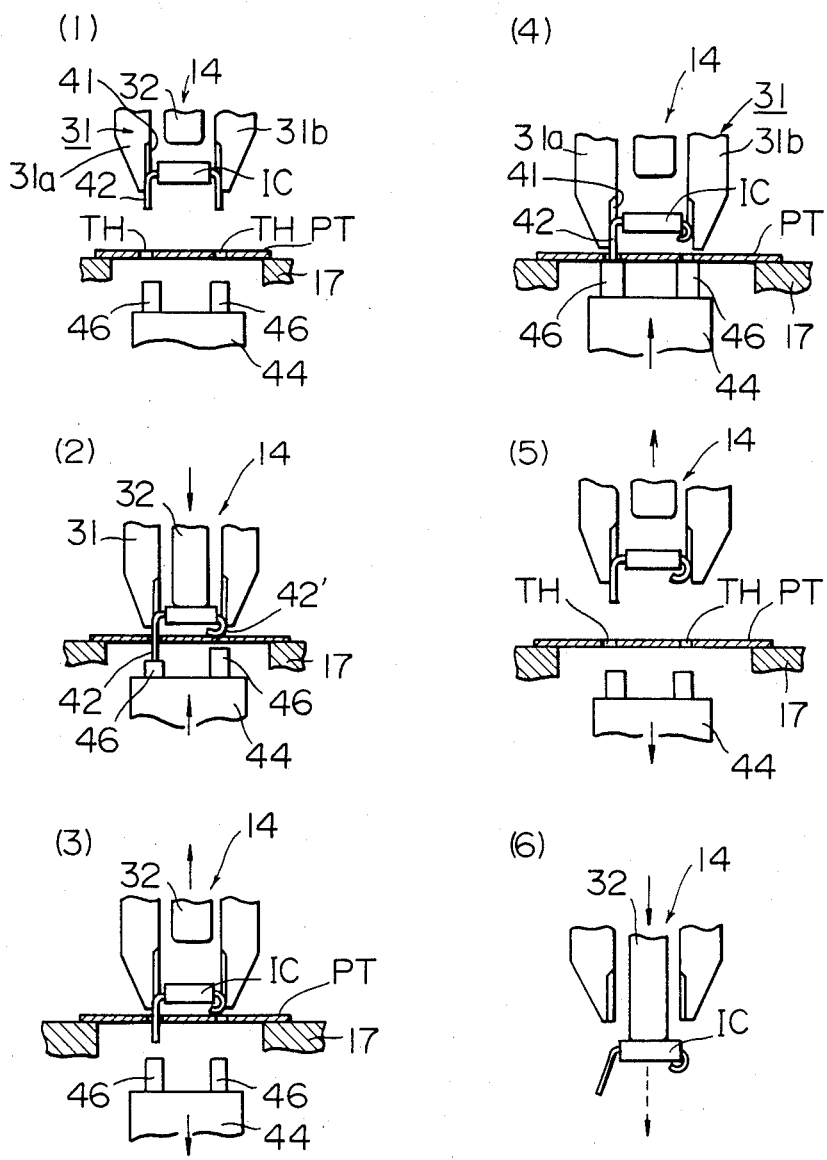
FIGS. 5(1) to 5(6) are explanatory views of the IC removing function of the system in accordance with an embodiment of the present invention.

(1) An IC is held by the picker 31 of the insertion head 14 and conveyed to a position above the printed circuit board PT, which is located at a predetermined position by the function of the X-Y table 17, in such a manner that each lead of the IC is positioned immediately above the corresponding through-hole TH (FIG. 5(1)). During this operation, the housing 44 is at the lower dead point position and the pantograph 57 (FIG. 4) is horizontally narrowed to retract the sliders 50 inward of the recess 49. The IC is held by the picker 31 in such a manner that the leads 42 of each side of the IC are disposed in a guide groove 41 of each of the finger plates 31a and 31b and each IC lead 42 is oriented vertically downward perpendicular to the printed circuit board PT. The IC is held between the pair of finger plates 31a and 31b by utilizing the resiliency of each IC lead which projects outward from the IC as illustrated by the left lead in FIG. 5(6).

(2) The insertion head 14 descends until it is close to the printed circuit board PT. Then, the pusher 32 is moved downward to push the IC downward, to insert each IC lead into the through-hole TH. The correctly inserted IC lead 42 projects downward below the printed circuit board PT, while misinserted IC lead 42' is bent under upon the upper surface of the printed circuit board PT (FIG. 5(2)). Then, the housing 44 is moved upward to abut the abutments 46 against the corresponding IC leads, and the pantograph 57 is horizontally expanded by the cylinder 56 (FIG. 4) to detect the misinsertion of the IC lead in the manner described previously.

If all of the IC leads are correctly inserted into the corresponding through-holes, a subsequent new IC is mounted in accordance with the sequence program.

On the other hand, if a misinserted IC lead 42' is detected, the misinserted IC is removed as follows.

(3) The housing 44 is moved downward (FIG. 5(3)), so that all of the abutments 46 project upward out of the hole 97 of the housing 44 and all of the sliders 50 move horizontally outward, since the pantograph 57 is in the horizontally expanded state so that each slider 50 is forced outward by the corresponding piano wire 52 without being blocked by the rod 54 which is retracted in the hole of the slider holder 48. Accordingly, the thickened portion 51 of each slider 50 is shifted to the position below the rod 54 of the abutment 46, and the rod 54 is prevented from moving downward into the recess 49 of the slider holder 48.

(4) The housing 44 is moved upward again (FIG. 5(4)), so that the abutments 46 abut the IC leads and push them upward, since the abutments 46 are prevented from moving downward due to the thickened portion 51 of the slider 50, and the misinserted IC is pushed upward and returned to a position between the pair of finger plates 31a and 31b, and is held again by the picker 31.

(5) The insertion head 14 is then moved upward (FIG. 5(5)), so that the misinserted IC is removed from the printed circuit board PT. The misinserted IC is conveyed to a position above the reject tray 21 (FIG. 1) by driving the arm 15 (FIG. 1).

(6) The pusher 32 is moved downward to discard the misinserted IC into the reject tray. (FIG. 5(6)).

Figure 6:
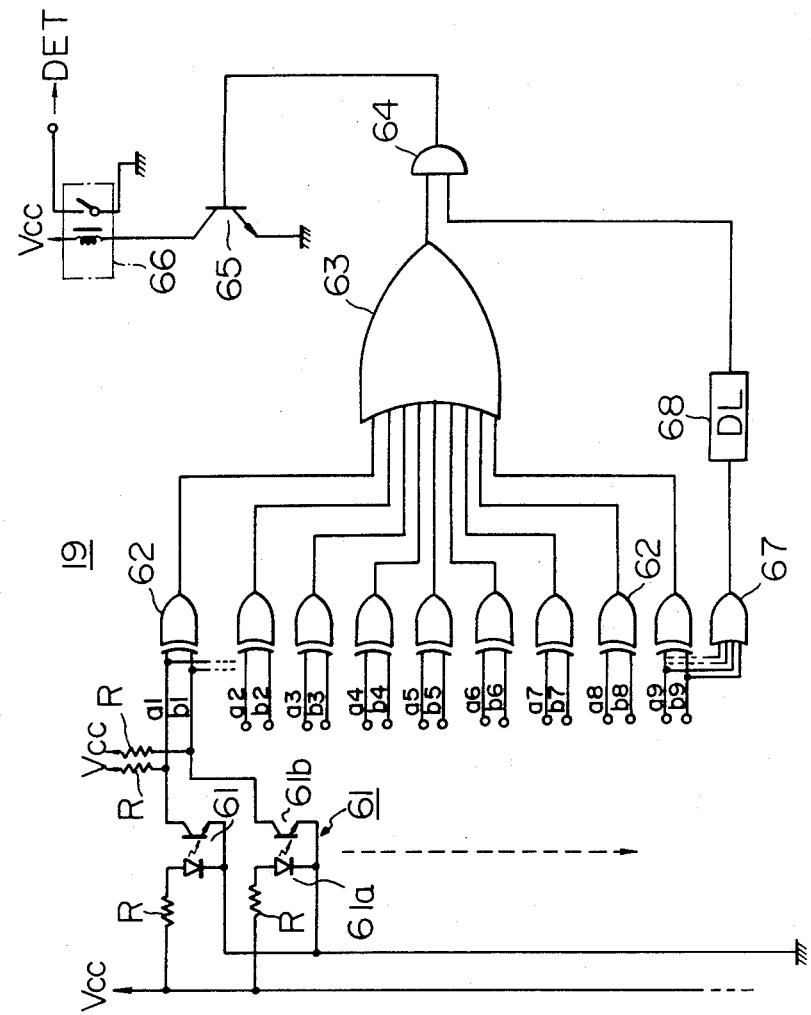
FIG. 6 is a circuit diagram of an example of the detection means used in the system in accordance with the present invention.

An example of the circuit of the detection means 19 is illustrated in FIG. 6. In the Figure, a DIP type IC comprises a plurality of pairs of leads ($A_1$, $B_1$), ($A_2$, $B_2$), ($A_3$, $B_3$) ---, on both longitudinal side faces thereof, as illustrated in FIG. 7, which is an upper view of a DIP type IC. Each lead is detected by the photosensor (photocoupler) 61 comprising a laser emitting diode (LED) 61a and a phototransistor 61b (FIG. 6), which are disposed at the entrance of the U-shaped sensor holder 53 (FIG. 4), as described previously. Detection signals $a_n$ and $b_n$ from each pair of leads $A_n$ and $B_n$ ($n=1$ to 9 in FIG. 6) are input to an exclusive OR gate (EOR) 62. All of the EOR gates 62, each of which receives detection signals from one of the pairs of IC leads, are connected to an OR gate 63.

If, for example, the lead $A_1$ (FIG. 7) is misinserted, the light from the LED 61a (FIG. 6) is blocked by the slider 50 (FIG. 4) as described previously, which prevents the flow of current through the phototransistor 61b, and thereby the signal $a_1$ is made an H level logic corresponding to $V_{CC}$. On the other hand, if the lead is correctly inserted, for example, lead $B_1$, the light from the LED 61a is not blocked by the slider 50 and thus is received by the phototransistor 61b, which energizes the phototransistor 61b and allows a current to pass therethrough, thus connecting $V_{CC}$ to the ground. Therefore, the signal $b_1$ is made L level. The output of the EOR gate 62 is H when one of the input signals is H, i.e., one of the pair of leads is misinserted. The output of the gate 62 is L when both of the input signals are either L or H, i.e., both of the pair of leads are correctly inserted or none of the pairs of leads covers the sensor means. This makes it possible to apply the detection circuit for detecting an IC having a small number of pairs of leads. That is, for example, the circuit of FIG. 6, which can detect nine pairs of IC leads, can be also used for examining an IC of FIG. 7 having seven pairs of IC leads, since all of the input signals introduced into the eighth and ninth EOR gates 62 are H level. Thus making the output of the EOR gates 62 L, which condition represents a state wherein no misinsertion has occurred.

If both of a pair of leads should be misinserted simultaneously, both of the input signals introduced to the EOR gate 62 are H, so that the EOR gate 62 emits an L level output, which means that no misinsertion is occurred. However, the situation in which both of a pair of leads are misinserted simultaneously has not occurred so far, even though the automatic mounting process has been used for millions of ICs, and probably will never occur.

The OR gate 63 emits an H level output signal when at least one of the output signals from the EOR gates 62 is H, i.e., at least one of the IC leads is misinserted.

The OR gate 63 is connected to one of the inputs of an AND gate 64, and a delay circuit 68 is connected to the other of the inputs of the AND gate 64. An OR gate 67, which is connected to each input line of each EOR gate 62, is connected to the delay circuit 68. The delay circuit 68 emits an H level logic signal at a predetermined time (about 0.1 second) after the start of the detection operation, as a guarantee that the detection operation for all pairs of IC leads has been accomplished. If a misinsertion is detected and the OR gate 63 emits an H output signal, this H signal from the OR gate 63 passes through the AND gate 64 at the predetermined time after the start of detection operation, due to the delay circuit 68, and actuates a transistor 65 which energizes a relay circuit 66 so as to emit a misinsertion signal (DET) having a logic L.

The constituents of the processor 11 are illustrated in FIG. 8. The processor 11 comprises a central processing unit (CPU) 81, a random access memory (RAM) 82, and an interface (INT) 83. Necessary data for controlling the system is introduced into the CPU 81 by a typewriter (TYP) 84 or tape 85. Also, information for controlling the whole system is introduced into the CPU 81 through an operation panel or console (CON) 86. References 87X and 87Y designate servomotors installed within the drive means 18X and 18Y of the X-Y table 17 (FIG. 1), respectively. Reference 87Z designates a servomotor for actuating the cylinder 45 for driving the housing 44 (FIG. 4). Reference 88 designates another servomotor for actuating the cylinder 56 for driving the pantograph 57 (FIG. 4). The interface 83 receives and introduces signals from various sensors to the CPU 81. The aforementioned misinsertion signal (DET) is included within such signals. Signals and information are transmitted through a data bus (DB) between the CPU 81 and the above-mentioned constituents of the processor.

Figure 9:
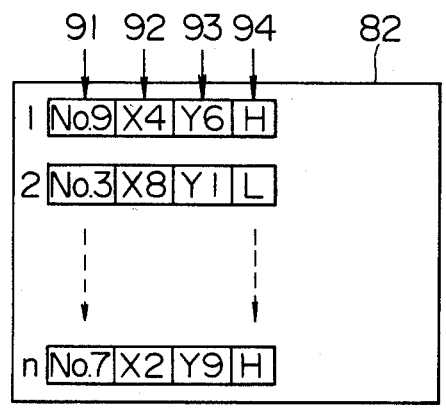
FIG. 9 is a layout view of an example of a RAM used in the diagram of FIG. 8.

An example of the layout of the RAM 82 of FIG. 8 is illustrated in FIG. 9. The memory area of the RAM 82 is represented by boxes in the drawing. The numbers (1, 2, n) marked to the left of the lines of boxes represent sequence numbers of n ICs to be mounted. The first memory area 91 of each line is used for memorizing the identification number of the IC to be mounted in the sequence of the line. The second and the third memory areas 92 and 93 are used for memorizing shift amounts of the X-Y table in the directions X and Y, respectively, so as to designate the position where the identified IC is mounted on the printed circuit board. The data to be memorized in the first to third memory areas 91, 92 and 93 is introduced by the typewriter 84 or tape 85 of FIG. 8.

The fourth memory area 94 of each line of boxes of the RAM 82 is used as a flag area, wherein the result of the detection of the IC leads is written every time when each IC mounting sequence of the line is ended. If the IC is misinserted, logic L is written in this area 94, and if the IC is correctly inserted, logic H is written in, as represented by step (d) of FIG. 2. When the processor confirms that the sequence program for mounting all ICs is ended in step (f) of FIG. 2, all flag areas 94 are searched for whether or not the logic L is written, in the step (g) of FIG. 2. In this particular example, the flag of the sequence No. 2 is logic L. Therefore, the CPU 81 orders the remounting of an IC in step (h) of FIG. 2. Then, the data of sequence No. 2 is read again and the identified IC (No. 3) is fed into the spreader 13 (FIG. 1) and the mounting sequence is repeated from step, (b) of FIG. 2. When the new IC is correctly remounted, the flag area 94 is rewritten from L to H.

Figure 10:
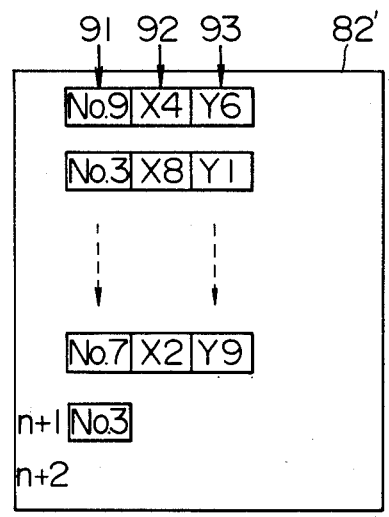
FIG. 10 is a layout view of another example of the RAM used in the diagram of FIG. 8.

Another example of the layout of memory area of the RAM which is designated by reference 82' is illustrated in FIG. 10. In this example, memory areas are provided below the last (nth) IC mounting sequence as numbered (n+1) and (n+2) in the drawing. The identification number (No. 3) of the IC misinserted in the second IC mounting sequence is written in the memory area of the (n+1)th sequence of the RAM 82' in step (d) of FIG. 2. The CPU 81 searches the (n+1)th memory area in step (g) of FIG. 2. If an IC identification number is written this area, the CPU 81 orders reinsertion of the IC in step (h) and a new IC identified in the (n+1)th memory area is remounted, so that all of the ICs are automatically mounted on the printed circuit board. In the example of FIG. 10, all ICs have a different identification number, so that, by specifying the identification number of the IC, the sequence number and the position of the IC can be read from the originally memorized sequence program. If ICs having a same identification number are included in the ICs to be mounted, the sequence number and the position of the misinserted IC may be also written in the (n+1)th memory area.

As mentioned above, in accordance with the present invention, it is possible to automatically replace the misinserted IC with a new IC without stopping the flow of the mounting sequence process.

If the misinserted IC cannot be replaced after the subsequent ICs have been mounted in advance of the replacement, for some spatial reason such as the adjacent IC is too close to the location of the misinserted IC, the sequence program for this kind of misinserted IC may be modified so that the misinserted IC is replaced immediately after the misinsertion is detected and before the subsequent ICs are mounted.

We claim:
1. An automatic IC mounting process for mounting a plurality of ICs via an IC insertion apparatus including a means for detecting if an IC is correctly mounted, said ICs being mounted on an upper surface of a printed circuit board having through-holes formed therein, in accordance with a predetermined sequence, each of said ICs having a plurality of leads which are to be inserted into predetermined corresponding ones of said through-holes, the process including:
   (i) a step for inserting said leads of an IC into a group of said through-holes of said printed circuit board defining a mounting position;
   (ii) a step for detecting whether or not each lead of said IC is correctly inserted into said corresponding through-hole after every step (i);
   (iii) a step for removing a misinserted IC having a misinserted lead from said printed circuit board immediately after a misinsertion is detected in said step (ii);
   (iv) a step for memorizing information for identifying said misinserted IC and the mounting position;
   (v) a step for mounting a predetermined number of ICs, subsequent to said detection, on said printed circuit board in accordance with said predetermined sequence, leaving the mounting position of said misinserted IC unmounted;
   (vi) a step for determining whether or not said information was memorized in said step (iv); and
   (vii) a step for preparing a replacement IC identified by said information and moving it on said printed circuit board at said mounting position.
2. An automatic IC mounting process according to claim 1, in which said step (ii) includes the substeps of:
   generating detection signals of pairs of opposing leads which are disposed on opposite sides of said IC;
   applying said detection siganls to respective EOR gates to generate respective misinsertion signals; and
   applying said misinsertion signals to an OR gate.
3. An automatic IC mounting process according to claim 2, in which said step (iv) includes the step of:
   storing said information in a RAM; and performing said sequence using a processor.
4. An automatic IC mounting apparatus for mounting a plurality of ICs on an upper surface of a printed circuit board having through-holes formed therein, in accordance with a predetermined sequence, each of said ICs having a plurality of leads which are to be inserted into predetermined corresponding ones of said through-holes, said apparatus including:

processor means for controlling said sequence and generating control signals;

spreader means for receiving and holding an IC;

IC feed means for feeding an IC onto said spreader means in accordance with one of said control signals;

conveyor means for conveying said IC from said spreader means to a position above said printed circuit board;

positioning means for positioning said printed circuit board so that said IC is positioned above a predetermined location of said printed circuit board;

IC insertion means for holding said IC, for pushing said IC toward said printed circuit board and for inserting said leads of said IC said through-holes of said printed circuit board so that said IC is mounted thereon;

detection means for detecting whether or not each IC lead is correctly inserted into said through-holes after inserting said IC by said IC insertion means, said detection means being disposed on a side of said printed circuit board opposite said IC insertion means and mounted on said positioning means;

abutment means mounted on said detection means, for abutting against said leads of said IC inserted into said through-holes of said printed circuit board;

IC removal means for removing a misinserted IC from said printed circuit board, upon the detection of a misinsertion by said detection means and for moving said abutment means so as to push said IC away from said positioning means;

memory means for memorizing information specifying said misinserted IC and corresponding mounting position; and wherein said processor generates said control signals such that a predetermined number of ICs are mounted after said misinserted IC is removed, leaving said corresponding mounting position empty and a replacement IC is mounted on said position in accordance with said memorized information after said subsequent ICs are mounted.

5. An automatic IC mounting apparatus according to claim 4, wherein said detection means comprises:

a plurality of sensor means for detecting each of said leads projecting through said through-hole, each of said sensor means being operatively connected to said abutment means; and a circuit including
EOR gates each operatively connected to a corresponding pair of sensor means located to detect opposing leads on opposite sides of said IC, and
an OR gate operatively connected to each of the EOR gates.

6. An automatic IC mounting apparatus according to claim 5, wherein said sensor means are disposed within a housing which is vertically movable under said printed circuit board and said abutment means comprises an abutment member which abuts against a lower end of said lead.

7. An automatic IC mounting apparatus according to claim 6, wherein: said abutment member is vertically movable with respect to said housing and has a lower portion which engages with a slider horizontally movable and having a thickened portion, which slider is actuated by a rhomboid pantograph which is horizontally expandable and contractible via a resilient rod member which is secured to said slider; so as to detect a lead, said pantograph is horizontally expanded so as to move said slider which, when the lead is correctly inserted, is prevented from movng by engagement of said lower portion of the abutment member with said thickened portion of said slider, while, when the lead is misinserted, is allowed to move by disengagement between said lower portion of the abutment member and said slider; and so as to remove said misinserted IC, said thickened portion is positioned below said abutment member so as to prevent the downward movement of said abutment member to cause said IC lead to be pushed upward by said abutment member when said housing is driven upward.

8. An automatic IC mounting apparatus according to claim 4, wherein said memory means comprises a RAM means, included in said processor, for storing an IC identification number, for storing said corresponding mounting position of the IC and for storing a flag identifying a misinserted IC.

9. An automatic IC mounting apparatus according to claim 4, wherein said memory means comprises a RAM means, included in said processor, for storing IC identification numbers, for storing said corresponding mounting position of the IC and for sotring information specifying said misinserted IC.

* * * * *

UNITED STATES PATENT AND TRADEMARK OFFICE
CERTIFICATE OF CORRECTION

PATENT NO. : 4,621,419

DATED : November 11, 1986

INVENTOR(S) : Hino et al.

It is certified that error appears in the above-identified patent and that said Letters Patent is hereby corrected as shown below:

Column 4, line 60, after "is" insert --read--.
Column 9, line 65, after "written" insert --in--.
Column 10, line 57, "siganls" should be --signals--.
Column 11, line 18, delete "IC into said"
Column 12, line 47, "sotring" should be --storing--.

Signed and Sealed this

Thirty-first Day of March, 1987

Attest:

DONALD J. QUIGG

Arresting Officer

Commissioner of Patents and Trademarks